US007003412B2

(12) United States Patent
Jensen et al.

(10) Patent No.: US 7,003,412 B2
(45) Date of Patent: Feb. 21, 2006

(54) METHOD AND SYSTEM FOR VERIFYING VOLTAGE IN AN ELECTRICAL SYSTEM

(75) Inventors: David L. Jensen, Barneveld, WI (US); G. Erich Heberlein, Jr., Everett, WA (US); David T. Rollay, Franklin, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 95 days.

(21) Appl. No.: 10/664,097

(22) Filed: Sep. 17, 2003

(65) Prior Publication Data
US 2005/0075808 A1    Apr. 7, 2005

(51) Int. Cl.
*G01R 19/00*    (2006.01)
(52) U.S. Cl. .............. 702/64; 702/60; 702/61; 702/62; 324/110; 324/74
(58) Field of Classification Search ............ 702/62, 702/61, 64, 90, 60; 324/110, 74–77, 140 R, 324/141, 142; 340/657, 658, 660, 661
See application file for complete search history.

(56) References Cited

U.S. PATENT DOCUMENTS

| 5,317,117 | A | | 5/1994 | Bruski et al. ........... 200/144 R |
| 6,112,158 | A | * | 8/2000 | Bond et al. .................... 702/61 |
| 6,429,785 | B1 | * | 8/2002 | Griffin et al. .......... 340/870.02 |
| 6,487,091 | B1 | | 11/2002 | Malkowski, Jr. et al. ... 361/826 |
| 6,629,046 | B1 | * | 9/2003 | Bond et al. .................... 702/61 |
| 6,675,071 | B1 | * | 1/2004 | Griffin et al. ............... 700/286 |
| 2002/0048161 | A1 | | 4/2002 | Malkowski et al. ........ 361/826 |
| 2003/0049958 | A1 | | 3/2003 | Bruski et al. ............... 439/344 |
| 2003/0051175 | A1 | | 3/2003 | Heberlein, Jr. et al. ..... 713/300 |
| 2003/0051176 | A1 | | 3/2003 | Heberlein, Jr. et al. ..... 713/300 |
| 2003/0072144 | A1 | | 4/2003 | Malkowski, Jr. et al. ... 361/826 |
| 2004/0150384 | A1 | * | 8/2004 | Holle et al. ................. 324/110 |

FOREIGN PATENT DOCUMENTS

| EP | 0 242 640 A | 10/1987 |
| EP | 0 332 705 A | 9/1989 |

* cited by examiner

*Primary Examiner*—Michael Nghiem
*Assistant Examiner*—Hien Vo
(74) *Attorney, Agent, or Firm*—Patrick S. Yoder; Alexander M. Gerasimow

(57) ABSTRACT

A system operable to detect voltages within an electrical device and provide an output based on the voltages detected by the system. The electrical device may include an isolation switch adapted to selectively isolate the electrical device from an electrical bus. The system may be operable to detect voltage data in the electrical bus and the electrical device downstream of the isolation switch. The system may provide an indication that voltage is detected in the electrical bus, but that no hazardous voltages are detected within the electrical device downstream of the isolation switch. The system may be adapted to produce a plurality of outputs based on the voltage data detected on the electrical bus and in the electrical device downstream of the isolation switch.

34 Claims, 6 Drawing Sheets

|     | MAIN | | | DS | | | FUSE | | | Device Diagnostic | Hazard Code |
|     | A | B | C | A | B | C | A | B | C | | |
| --- | --- | --- | --- | --- | --- | --- | --- | --- | --- | --- | --- |
| 0   | 0 | 0 | 0 | 0 | 0 | 0 | 0 | 0 | 0 | Main Off | Main Fault |
| 1   | 0 | 0 | 0 | 0 | 0 | 0 | 0 | 0 | 1 | Illegal Condition | System Fault |
| 64  | 0 | 0 | 1 | 0 | 0 | 0 | 0 | 0 | 0 | Main Fault | Main Fault |
| 65  | 0 | 0 | 1 | 0 | 0 | 0 | 0 | 0 | 1 | Illegal Condition | System Fault |
| 72  | 0 | 0 | 1 | 0 | 0 | 1 | 0 | 0 | 0 | Main Fault | Main Fault |
| 73  | 0 | 0 | 1 | 0 | 0 | 1 | 0 | 0 | 1 | Main Fault | Main Fault |
| 74  | 0 | 0 | 1 | 0 | 0 | 1 | 0 | 1 | 0 | Illegal Condition | System Fault |
| 128 | 0 | 1 | 0 | 0 | 0 | 0 | 0 | 0 | 0 | Main Fault | Main Fault |
| 129 | 0 | 1 | 0 | 0 | 0 | 0 | 0 | 0 | 1 | Illegal Condition | System Fault |
| 144 | 0 | 1 | 0 | 0 | 1 | 0 | 0 | 0 | 0 | Main Fault | Main Fault |
| 145 | 0 | 1 | 0 | 0 | 1 | 0 | 0 | 0 | 1 | Illegal Condition | System Fault |
| 146 | 0 | 1 | 0 | 0 | 1 | 0 | 0 | 1 | 0 | Main Fault | Main Fault |
| 147 | 0 | 1 | 0 | 0 | 1 | 0 | 0 | 1 | 1 | Illegal Condition | System Fault |
| 192 | 0 | 1 | 1 | 0 | 0 | 0 | 0 | 0 | 0 | Main Fault | Main Fault |
| 193 | 0 | 1 | 1 | 0 | 0 | 0 | 0 | 0 | 1 | Illegal Condition | System Fault |
| 216 | 0 | 1 | 1 | 0 | 1 | 1 | 0 | 0 | 0 | Main Fault | Main Fault |
| 217 | 0 | 1 | 1 | 0 | 1 | 1 | 0 | 0 | 1 | Main Fault | Main Fault |
| 218 | 0 | 1 | 1 | 0 | 1 | 1 | 0 | 1 | 0 | Main Fault | Main Fault |
| 219 | 0 | 1 | 1 | 0 | 1 | 1 | 0 | 1 | 1 | Main Fault | Main Fault |
| 220 | 0 | 1 | 1 | 0 | 1 | 1 | 1 | 0 | 0 | Illegal Condition | System Fault |
| 256 | 1 | 0 | 0 | 0 | 0 | 0 | 0 | 0 | 0 | Main Fault | Main Fault |
| 257 | 1 | 0 | 0 | 0 | 0 | 0 | 0 | 0 | 1 | Illegal Condition | System Fault |
| 288 | 1 | 0 | 0 | 1 | 0 | 0 | 0 | 0 | 0 | Main Fault | Main Fault |
| 289 | 1 | 0 | 0 | 1 | 0 | 0 | 0 | 0 | 1 | Illegal Condition | System Fault |
| 290 | 1 | 0 | 0 | 1 | 0 | 0 | 0 | 1 | 0 | Illegal Condition | System Fault |
| 291 | 1 | 0 | 0 | 1 | 0 | 0 | 0 | 1 | 1 | Illegal Condition | System Fault |
| 292 | 1 | 0 | 0 | 1 | 0 | 0 | 1 | 0 | 0 | Main Fault | Main Fault |
| 293 | 1 | 0 | 0 | 1 | 0 | 0 | 1 | 0 | 1 | Illegal Condition | System Fault |

FIG. 4A

|     | MAIN | | | DS | | | FUSE | | | Device Diagnostic | Hazard Code |
|     | A | B | C | A | B | C | A | B | C | | |
| --- | --- | --- | --- | --- | --- | --- | --- | --- | --- | --- | --- |
| 320 | 1 | 0 | 1 | 0 | 0 | 0 | 0 | 0 | 0 | Main Fault | Main Fault |
| 321 | 1 | 0 | 1 | 0 | 0 | 0 | 0 | 0 | 1 | Illegal Condition | System Fault |
| 360 | 1 | 0 | 1 | 1 | 0 | 1 | 0 | 0 | 0 | Main Fault | Main Fault |
| 361 | 1 | 0 | 1 | 1 | 0 | 1 | 0 | 0 | 1 | Main Fault | |
| 362 | 1 | 0 | 1 | 1 | 0 | 1 | 0 | 1 | 0 | Illegal Condition | System Fault |
| 363 | 1 | 0 | 1 | 1 | 0 | 1 | 0 | 1 | 1 | Illegal Condition | System Fault |
| 364 | 1 | 0 | 1 | 1 | 0 | 1 | 1 | 0 | 0 | Main Fault | Main Fault |
| 365 | 1 | 0 | 1 | 1 | 0 | 1 | 1 | 0 | 1 | Main Fault | Main Fault |
| 366 | 1 | 0 | 1 | 1 | 0 | 1 | 1 | 1 | 0 | Illegal Condition | System Fault |
| 384 | 1 | 1 | 0 | 0 | 0 | 0 | 0 | 0 | 0 | Main Fault | Main Fault |
| 385 | 1 | 1 | 0 | 0 | 0 | 0 | 0 | 0 | 1 | Illegal Condition | System Fault |
| 432 | 1 | 1 | 0 | 1 | 1 | 0 | 0 | 0 | 0 | Main Fault | Main Fault |
| 433 | 1 | 1 | 0 | 1 | 1 | 0 | 0 | 0 | 1 | Illegal Condition | System Fault |
| 434 | 1 | 1 | 0 | 1 | 1 | 0 | 0 | 1 | 0 | Main Fault | Main Fault |
| 435 | 1 | 1 | 0 | 1 | 1 | 0 | 0 | 1 | 1 | Illegal Condition | System Fault |
| 436 | 1 | 1 | 0 | 1 | 1 | 0 | 1 | 0 | 0 | Main Fault | Main Fault |
| 437 | 1 | 1 | 0 | 1 | 1 | 0 | 1 | 0 | 1 | Illegal Condition | System Fault |
| 438 | 1 | 1 | 0 | 1 | 1 | 0 | 1 | 1 | 0 | Main Fault | Main Fault |
| 439 | 1 | 1 | 0 | 1 | 1 | 0 | 1 | 1 | 1 | Illegal Condition | System Fault |
| 448 | 1 | 1 | 1 | 0 | 0 | 0 | 0 | 0 | 0 | Unit Power Off | Unit Power Off |
| 449 | 1 | 1 | 1 | 0 | 0 | 0 | 0 | 0 | 1 | Illegal Condition | System Fault |
| 456 | 1 | 1 | 1 | 0 | 0 | 1 | 0 | 0 | 0 | DS Fault | Disc Sw Fault |
| 457 | 1 | 1 | 1 | 0 | 0 | 1 | 0 | 0 | 1 | DS Fault | Disc Sw Fault |
| 458 | 1 | 1 | 1 | 0 | 0 | 1 | 0 | 1 | 0 | Illegal Condition | System Fault |
| 464 | 1 | 1 | 1 | 0 | 1 | 0 | 0 | 0 | 0 | DS Fault | Disc Sw Fault |
| 465 | 1 | 1 | 1 | 0 | 1 | 0 | 0 | 0 | 1 | Illegal Condition | System Fault |
| 466 | 1 | 1 | 1 | 0 | 1 | 0 | 0 | 1 | 0 | DS Fault | Disc Sw Fault |
| 467 | 1 | 1 | 1 | 0 | 1 | 0 | 0 | 1 | 1 | Illegal Condition | System Fault |
| 472 | 1 | 1 | 1 | 0 | 1 | 1 | 0 | 0 | 0 | DS Fault | Disc Sw Fault |
| 473 | 1 | 1 | 1 | 0 | 1 | 1 | 0 | 0 | 1 | DS Fault | Disc Sw Fault |
| 474 | 1 | 1 | 1 | 0 | 1 | 1 | 0 | 1 | 0 | DS Fault | Disc Sw Fault |
| 475 | 1 | 1 | 1 | 0 | 1 | 1 | 0 | 1 | 1 | DS Fault | Disc Sw Fault |
| 476 | 1 | 1 | 1 | 0 | 1 | 1 | 1 | 0 | 0 | Illegal Condition | System Fault |

FIG. 4B

|  | MAIN | | | DS | | | FUSE | | | Device Diagnostic | Hazard Code |
|---|---|---|---|---|---|---|---|---|---|---|---|
|  | A | B | C | A | B | C | A | B | C |  |  |
| 477 | 1 | 1 | 1 | 0 | 1 | 1 | 1 | 0 | 1 | Illegal Condition | System Fault |
| 478 | 1 | 1 | 1 | 0 | 1 | 1 | 1 | 1 | 0 | Illegal Condition | System Fault |
| 479 | 1 | 1 | 1 | 0 | 1 | 1 | 1 | 1 | 1 | Illegal Condition | System Fault |
| 480 | 1 | 1 | 1 | 1 | 0 | 0 | 0 | 0 | 0 | DS Fault | Disc Sw Fault |
| 481 | 1 | 1 | 1 | 1 | 0 | 0 | 0 | 0 | 1 | Illegal Condition | System Fault |
| 482 | 1 | 1 | 1 | 1 | 0 | 0 | 0 | 1 | 0 | Illegal Condition | System Fault |
| 483 | 1 | 1 | 1 | 1 | 0 | 0 | 0 | 1 | 1 | Illegal Condition | System Fault |
| 484 | 1 | 1 | 1 | 1 | 0 | 0 | 1 | 0 | 0 | DS Fault | Disc Sw Fault |
| 485 | 1 | 1 | 1 | 1 | 0 | 0 | 1 | 0 | 1 | Illegal Condition | System Fault |
| 486 | 1 | 1 | 1 | 1 | 0 | 0 | 1 | 1 | 0 | Illegal Condition | System Fault |
| 487 | 1 | 1 | 1 | 1 | 0 | 0 | 1 | 1 | 1 | Illegal Condition | System Fault |
| 488 | 1 | 1 | 1 | 1 | 0 | 1 | 0 | 0 | 0 | DS Fault | Disc Sw Fault |
| 489 | 1 | 1 | 1 | 1 | 0 | 1 | 0 | 0 | 1 | DS Fault | Disc Sw Fault |
| 490 | 1 | 1 | 1 | 1 | 0 | 1 | 0 | 1 | 0 | Illegal Condition | System Fault |
| 491 | 1 | 1 | 1 | 1 | 0 | 1 | 0 | 1 | 1 | Illegal Condition | System Fault |
| 492 | 1 | 1 | 1 | 1 | 0 | 1 | 1 | 0 | 0 | DS Fault | Disc Sw Fault |
| 493 | 1 | 1 | 1 | 1 | 0 | 1 | 1 | 0 | 1 | DS Fault | Disc Sw Fault |
| 494 | 1 | 1 | 1 | 1 | 0 | 1 | 1 | 1 | 0 | Illegal Condition | System Fault |
| 495 | 1 | 1 | 1 | 1 | 0 | 1 | 1 | 1 | 1 | Illegal Condition | System Fault |
| 496 | 1 | 1 | 1 | 1 | 1 | 0 | 0 | 0 | 0 | DS Fault | Disc Sw Fault |
| 497 | 1 | 1 | 1 | 1 | 1 | 0 | 0 | 0 | 1 | Illegal Condition | System Fault |
| 498 | 1 | 1 | 1 | 1 | 1 | 0 | 0 | 1 | 0 | DS Fault | Disc Sw Fault |
| 499 | 1 | 1 | 1 | 1 | 1 | 0 | 0 | 1 | 1 | Illegal Condition | System Fault |
| 500 | 1 | 1 | 1 | 1 | 1 | 0 | 1 | 0 | 0 | DS Fault | Disc Sw Fault |
| 501 | 1 | 1 | 1 | 1 | 1 | 0 | 1 | 0 | 1 | Illegal Condition | System Fault |
| 502 | 1 | 1 | 1 | 1 | 1 | 0 | 1 | 1 | 0 | DS Fault | Disc Sw Fault |
| 503 | 1 | 1 | 1 | 1 | 1 | 0 | 1 | 1 | 1 | Illegal Condition | System Fault |
| 504 | 1 | 1 | 1 | 1 | 1 | 1 | 0 | 0 | 0 | Blown Fuse | Blown Fuse |
| 505 | 1 | 1 | 1 | 1 | 1 | 1 | 0 | 0 | 1 | Blown Fuse | Blown Fuse |
| 506 | 1 | 1 | 1 | 1 | 1 | 1 | 0 | 1 | 0 | Blown Fuse | Blown Fuse |
| 507 | 1 | 1 | 1 | 1 | 1 | 1 | 0 | 1 | 1 | Blown Fuse | Blown Fuse |
| 508 | 1 | 1 | 1 | 1 | 1 | 1 | 1 | 0 | 0 | Blown Fuse | Blown Fuse |
| 509 | 1 | 1 | 1 | 1 | 1 | 1 | 1 | 0 | 1 | Blown Fuse | Blown Fuse |
| 510 | 1 | 1 | 1 | 1 | 1 | 1 | 1 | 1 | 0 | Blown Fuse | Blown Fuse |
| 511 | 1 | 1 | 1 | 1 | 1 | 1 | 1 | 1 | 1 | All On | All On - Normal |

FIG. 4C

METHOD AND SYSTEM FOR VERIFYING VOLTAGE IN AN ELECTRICAL SYSTEM

BACKGROUND OF THE INVENTION

1. Field of the Invention

The present invention relates generally to the field of enclosures housing electrical equipment. More particularly, the invention relates to a technique for positively identifying that electrical power is not present in at least a portion of an enclosure housing an electrical device.

2. Description of the Related Art

Many types of electrical devices are comprised of electrical components housed within an enclosure. These enclosures may serve many purposes. For example, an enclosure may be used to protect the electrical components of the device from the environment. Alternatively, an enclosure may be used to protect people from the electrical components housed within the enclosure and, more importantly, from the electrical hazards associated therewith.

Occasionally, it may be desirable to enter an enclosure to access the electrical components. For safety reasons, it is preferable that there be no hazardous power be supplied to an electrical device when entering the enclosure to access the electrical components. The components must be considered energized until the absence of any hazardous voltages within the enclosure is verified.

The presence or absence of a hazardous voltage within an electrical device may be detected with a voltmeter. However, typically the enclosure must be opened to enable a user to access the electrical components with the voltmeter. However, because each components has not been verified as "de-energized", the device must still be considered energized, and special safety precautions may be required. The special safety precautions often require personal protective equipment to be used, which may be awkward to work in and hamper the taking of measurements. In addition, taking voltage measurements with a voltmeter may not detect when there is a temporary loss of power upstream of the device. This may produce a false indication that power to the electrical device has been removed. When the power upstream of the device is restored, the electrical components within the enclosure may be re-energized. Therefore, this method does provide a positive verification that the electrical device has been de-energized and, most importantly, exposes the user to electrical hazards.

A light may be connected at a point within an electrical circuit of the device to indicate the presence of a voltage. The light may be connected in the electrical circuit so that it is illuminated if there is a voltage present, thereby providing an indication of the presence of a voltage in the circuit. However, the converse is not true. For example, if the light is not illuminated, it may mean that there is no voltage in the circuit. However, it may also mean that the bulb simply has failed. In addition, this method also cannot detect a temporary loss of power upstream of the device. Therefore, this method also does provide a positive verification of the absence of a voltage within the device.

In addition, it may be desired to detect voltages within an electrical device to troubleshoot a problem within the electrical device or simply to verify the proper operation of the electrical components within the device. For example, if a voltage is detected at a point upstream of a component, but not detected at a point downstream of the component, then there is an open in the circuit between the two points. The open in the circuit may be due to the failure of the component.

A need exists for a technique to enable the absence of a hazardous voltage within an electrical device to be verified without a person having to access the interior of the device to take voltage measurements. Furthermore, there is a need for a technique to enable a positive indication that a voltage is not present within an electrical device to be provided to a person before entering the electrical device.

SUMMARY OF THE INVENTION

A system operable to detect voltages within an electrical enclosure or devices and provide an output based on the voltages detected by the system. The electrical device may comprise an isolation switch adapted to selectively isolate the electrical device from an electrical bus. The system may be operable to detect voltage on the electrical bus and the electrical device downstream of the isolation switch. The system may provide an indication that voltage is detected on the electrical bus, but that no hazardous voltages are detected within the electrical device downstream of the isolation switch. The system may be adapted to produce a plurality of outputs based on the voltage detected on the electrical bus and in the electrical device downstream of the isolation switch.

BRIEF DESCRIPTION OF THE DRAWINGS

The foregoing and other advantages and features of the invention will become apparent upon reading the following detailed description and upon reference to the drawings in which:

FIGS. 4A–4C are a logic table for the voltage verification system of FIG. 3.

DETAILED DESCRIPTION OF SPECIFIC EMBODIMENTS

Figure 1:
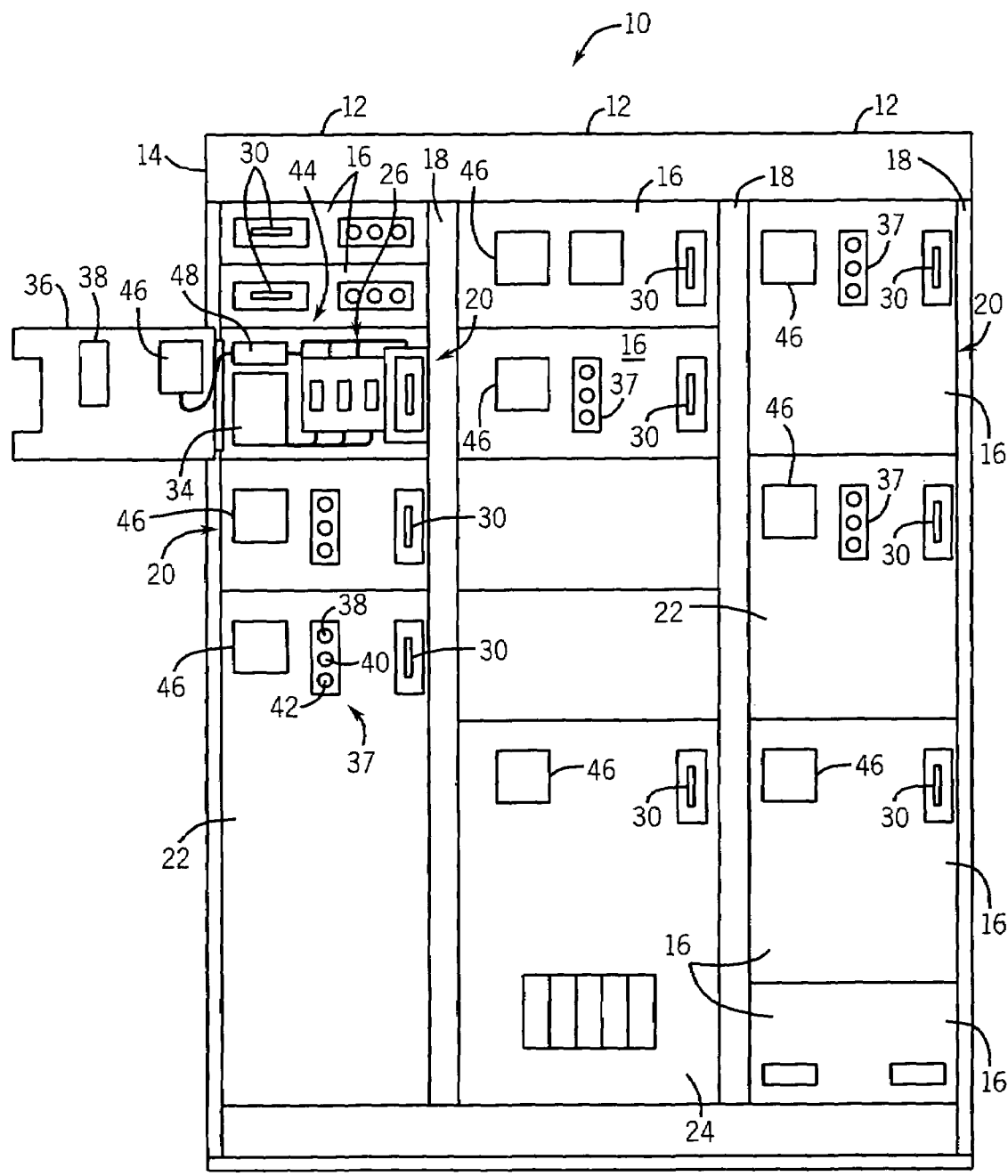
FIG. 1 is a front elevation view of a motor control center, in accordance with an embodiment of the present technique.

Turning now to the drawings, and referring first to FIG. 1, a motor control center (MCC) 10 is illustrated. However, the techniques described herein may be used in other electrical devices. In a typical factory setting, one or more such MCC installations may be made to control a large number of material handling, manufacturing, packaging, processing, and other equipment. In the illustrated embodiment, the MCC comprises three sections 12. However, a greater or lesser number of sections 12 may be used. The MCC 10 receives three-phase line power and couples it to each section 12. In the illustrated embodiment, each section 12 has an enclosure 14 that is adapted to couple power to a plurality of units 16. In the illustrated embodiments, the units 16 are adapted to "plug-in" to the MCC 10. However, other methods of coupling the units 16 to the MCC, and other devices, may be used. The units 16, in turn, are adapted to be disposed into the enclosures 14 to receive power. The units 16 may also receive non-hazardous power from a low-voltage (e.g. 24 volt DC) power source. In addition, the units 16 may receive and transmit data via a pre-established data protocol, such as the DeviceNet protocol established by Allen-Bradley Company, LLC of Milwaukee, Wis. In this embodiment, each section 12 has a wire way 18 for routing the communication wiring.

In the illustrated embodiment, the various units 16 comprise several motor controllers 20 that are plugged into the MCC 10 to receive power. The motor controllers 20 are adapted to selectively control power to one or more electric motors. In this embodiment, the motor controllers 20 receive three-phase ac power from the MCC. Alternatively, the motor controller 20 may provide ac power to a variable frequency drive 22 to enable the variable frequency drives 22 to produce a variable frequency ac to power one or more electric motors. The variable frequency ac power is coupled from each variable frequency drive 22 to a motor via a motor controller 20. In the illustrated embodiment, a programmable logic controller (PLC) 24 is provided to enable one or more devices to be controlled automatically either from the PLC or via the communications network.

A disconnect 26 is provided to isolate a unit 16 from the MCC. In the illustrated embodiment, each disconnect 26 is adapted with three switches 28, one for each phase of the three-phase alternating current. Each disconnect 26 has a handle 30 disposed on the exterior of the unit 16 that is operable to open and close the switches 28. In addition, the disconnect 26 is adapted to house a short-circuit protection device. In the illustrated embodiment, the short-circuit protection device comprises three fuses 32, one for each phase of the three-phase alternating current. However, other short-circuit protection devices may be used. In the illustrated embodiment, the three-phase power is coupled to electrical components 34 within the unit 16.

Each of the units 16 has a door 36 to enable the interior of each unit 16 to be accessed. In addition, some units 16 have a control station 37. In the illustrated embodiment, the control station 37 has a light 38 to provide an indication when the unit 16 is operating. A second light 40 is provided to indicate when an overload condition, or some other fault condition, exists. A control switch 42 is provided to control operation of the unit 16.

The units 16 have a voltage verification system 44 that, among other things, is adapted to detect automatically the presence or absence of hazardous voltages at various locations inside the MCC and the units 16 without having to open the door 36. In the illustrated embodiment, the voltage verification systems 44 are adapted with an indicator 46 that is visible from the exterior of the unit 16 with the door 36 closed. The voltage verification system 44 is adapted to provide a positive visual indication of an improper condition, a fault, and/or the presence or absence of voltages inside the MCC and the unit 16 via the indicator 46. As an alternative, the positive visual indication may be provided on a control station 37.

In the illustrated embodiment, each voltage verification system 44 is adapted to detect the voltage on each phase of the three-phase power inside the MCC 10 that is provided to a unit 16. Each voltage verification system 44 also is adapted to detect the voltage on each phase of the three-phase power downstream of the switches 28 of the disconnect 26, but upstream of the fuses 32. In addition, in the illustrated embodiment, the voltage verification system 44 is adapted to detect voltages on each phase of the three-phase power downstream of the fuses 32.

Each voltage verification system 44 comprises a processor unit 48 coupled to a plurality of voltage detectors disposed in the MCC and in a unit 16, in the illustrated embodiment. The voltage detectors may be contact or non-contact sensors. The processor unit 48 is adapted to receive data signals from the voltage detectors and process the data to identify the operating condition of the unit 16, such as a normal condition or a fault condition, based on the voltage data from the plurality of voltage detectors. The voltage verification system 44 also is adapted to verify that there is power in the power lines to the disconnect 26 of a unit 16 and that no hazardous voltages are present inside the unit 16 downstream of the disconnect 26 when the disconnect 26 is open. Thereby, providing an indication that the unit 16 is electrically isolated from the power bus within the MCC 10 and that the MCC bus power is not temporarily disabled. Redundancy may be utilized as a check-and-balance for the logic sensor or the processor.

Figure 2:
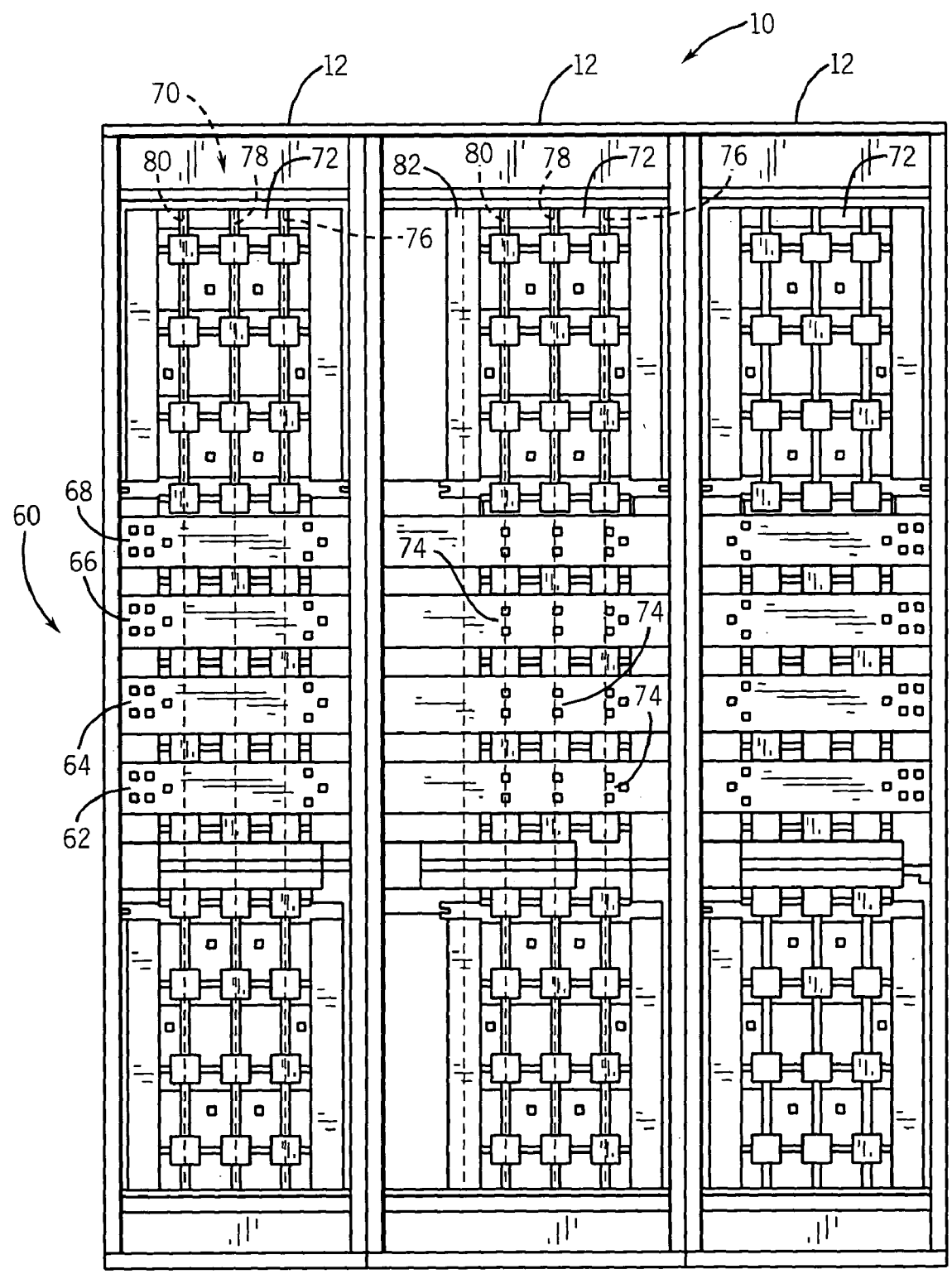
FIG. 2 is a rear elevation view of the motor control center of FIG. 1.

Referring generally to FIG. 2, in the illustrated embodiment, three-phase alternating current is supplied to each section 12 via a series of horizontal bus bars 60. In this embodiment, the horizontal bus bars 60 comprise a first horizontal bus bar 62, a second horizontal bus bar 64, a third horizontal bus bar 66, and a fourth horizontal bus bar 68. In this embodiment, the fourth horizontal bus bar 68 is coupled to a neutral electrical bus and the three lower horizontal bus bars 62, 64, and 66 are each coupled to a different phase of the three-phase line power supplied to the MCC 10. Power from the horizontal bus bars 60 is coupled to a series of vertical bus bars 70 disposed behind panels 72 by a series of connectors 74. In the illustrated embodiment, the first horizontal bus bar 62 is coupled to a first vertical bus bar 76, the second horizontal bus bar 64 is coupled to a second vertical bus bar 78, the third horizontal bus bar 66 is coupled to a third vertical bus bar 80, and the fourth horizontal bus bar 68, the neutral bus, is coupled to a fourth vertical bus bar 82. Devices requiring single-phase alternating current may be supplied with power by connecting the device to two of the vertical bus bars 76, 78, 80. Devices requiring three-phase ac power are supplied with power by connecting the device to all three of the ac power vertical bus bars 76, 78, 80. The units 16 are connected to the vertical bus bars by inserting a connector 90 (illustrated in FIG. 3) around each of the vertical bus bars 70.

Figure 3:
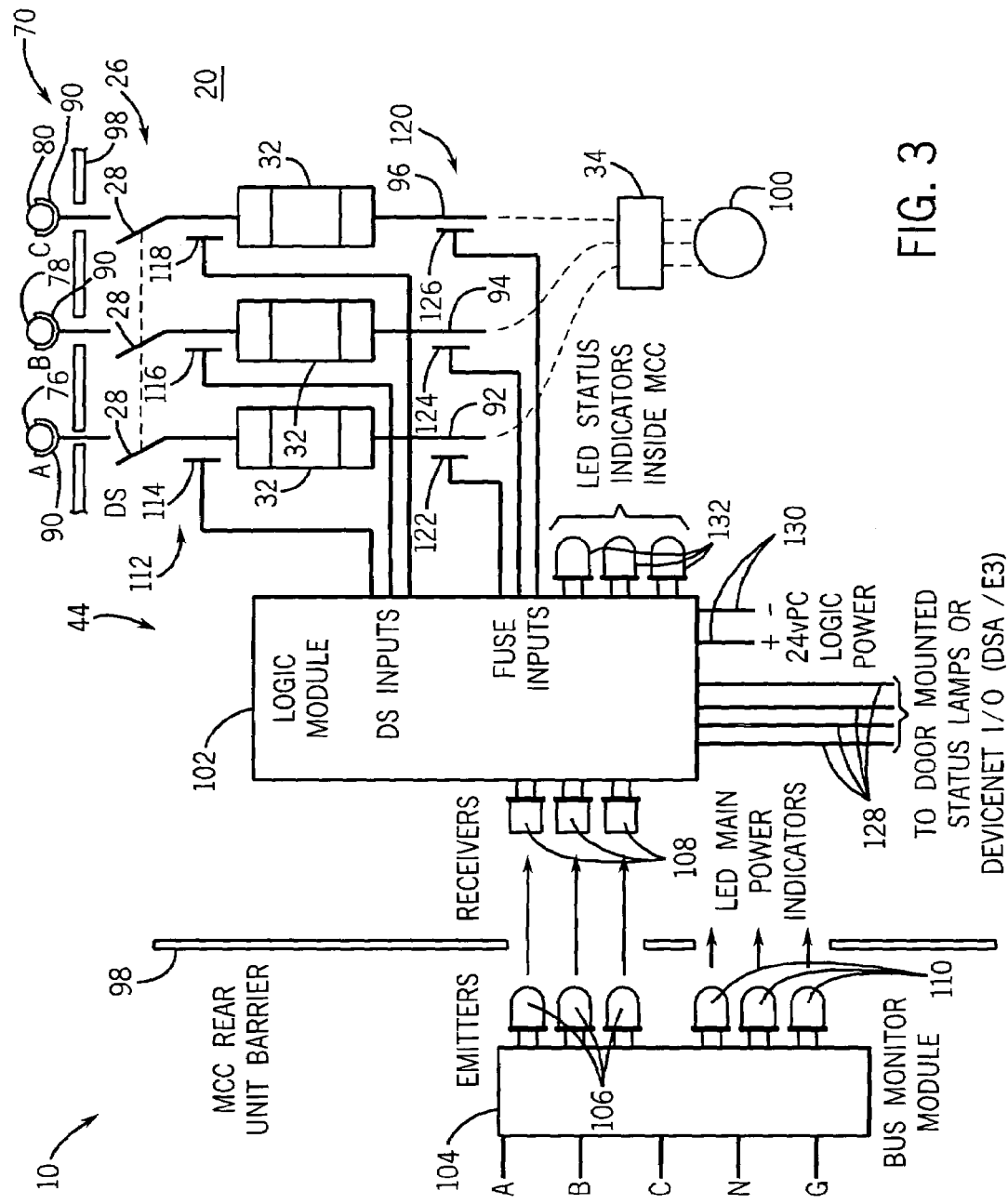
FIG. 3 is schematic diagram of a voltage verification system, in accordance with an embodiment of the present technique.

Referring generally to FIG. 3, an embodiment of a voltage verification system 44 is provided. The voltage verification system 44 is adapted to detect the voltage in each of the vertical bus bars 70 illustrated in FIG. 2, and neutral if provided in relationship to earth ground. In addition, the voltage verification system 44 is adapted to detect various voltages within a motor controller 20. However, the voltage verification system 44 may be used with units and devices other than a motor controller. In addition, the voltage verification system 44 is adapted to provide an indication when proper, improper, or fault conditions are detected within the motor controller 20.

In the illustrated embodiment, the motor controller 20 receives three-phase line power from the vertical bus bars 70. The three phases of the three-phase alternating current are conducted through the vertical bus bars 70 are labeled, "A", "B", and "C", respectively. However, the voltage verification system 44 may be used in a single-phase system or more phases, dc power, as well. In addition, in the illustrated embodiment, the motor controller 20 is coupled to a communications network to receive and transmit data via a pre-established data protocol. The data may be transmitted optically or using a non-hazardous voltage so that the communications network signals need not be de-energized prior to entering the motor controller 20.

The motor controller 20 is disposed within the MCC 10 such that connectors 90 of the motor controller 20 are stabbed onto the first vertical bus bar 76, the second vertical bus bar 78, and the third vertical bus bar 80. A first electrical phase 92 within the motor controller 20 is coupled to the first vertical bus bar 76, a second phase 94 is coupled to the second vertical bus bar 78, and a third phase 96 is coupled to the third vertical bus bar 80. The connectors 90 are coupled to the switches 28 of a disconnect 26 that is provided to selectively control bus power from the vertical bus bars 70 to the motor controller 20 and on to the motor. The disconnect 26 is disposed against a rear barrier 98 of the motor controller 20 so that there is no line power from the vertical bus bars 70 accessible inside the motor controller 20 when the disconnect switches 28 are open. In the illustrated embodiment, each phase of the three-phase power has a protective fuse 32. Alternatively, a circuit breaker may be used, rather than the disconnect 26 and fuses 32. Downstream of the fuses 32 are motor controller components 34 that are adapted to provide power to an electric motor 100.

In the illustrated embodiment, the processor unit 48 of the voltage verification system 44 comprises a logic module 102. In addition, the voltage verification system comprises a bus monitor module 104 disposed within the enclosure 14 of the MCC 10 and adapted to detect the voltages in each phase of the three-phase alternating current in the vertical bus bars 70, and neutral if provided in relationship to earth ground. In the illustrated embodiment, the bus monitor module 104 has a plurality of emitters 106, such as LEDs, to transmit bus phase voltage data to corresponding receivers 108 on the logic module 102. The emitters 106 are used so that the bus monitor module 104 is electrically isolated from the interior of the motor controller 20. Preferably, the emitters 106 produce an infrared signal. In addition, in this embodiment, the bus monitor module 104 has a plurality of emitters 110 to produce a visible indication of power of each phase of line power. As an alternative, non-contact sensors may be used to monitor bus voltage. The non-contact sensors may be electrically coupled to the logic module 102.

In the illustrated embodiment, the voltage verification system 44 has a first group 112 of voltage sensors that are adapted to detect voltage on each phase of the three-phase power downstream of the disconnect 26. A first voltage sensor 114 is provided to detect voltage on phase "A" downstream of the disconnect 26 and upstream of the fuse 32. A second voltage sensor 116 is provided to detect voltage on phase "B" downstream of the disconnect 26 and upstream of the fuse 32. A third voltage detector 118 is provided to detect voltage on phase "C" downstream of the disconnect 26 and upstream of the fuse 32.

In addition, the illustrated voltage verification system 44 also has a second group 120 of voltage sensors that are adapted to detect voltage on each phase of the three-phase power downstream of the fuses. A fourth voltage sensor 122 is provided to detect voltage on phase "A" downstream of the fuse and upstream of the motor controller components 34. A second voltage sensor 124 is provided to detect voltage on phase "B" downstream of the fuse and upstream of the motor controller components. A third voltage sensor 126 is provided to detect voltage on phase "C" downstream of the fuse and upstream of the motor controller components.

In the illustrated embodiment, the logic module 102 receives voltage data and identifies a logic state corresponding to the voltage data. The logic module 102 is operable to produce an output based on the logic state identified by the logic module 102. A first output 128 of the logic module 102 is coupled to the indicators 46 disposed on the door 36 (illustrated in FIG. 2) of the motor controller 20 and a communications network. The logic module 102 receives non-hazardous 24 Vdc power from a logic power bus 130. The logic module 102 also comprises indicators 132 disposed on the inside of the motor controller 20.

Referring generally to FIGS. 3 and 4A–4C, the logic module 102 is adapted to produce an output representative of an operational condition according to a logic table 140 stored within the logic module 102. When a voltage sensor detects the presence of a voltage, the voltage is represented in the logic table for that input as a "1." When a sensor detects no voltage, the voltage is represented in the logic table for that input as a "0." The voltage may be converted to "1's" and "0's" by the logic module 102 or by other circuitry in the processor unit 48. The logic table 140 comprises all of the possible logic states 142, i.e., each possible combination of 1's and 0's, for the given number of voltage sensors. If a greater number of sensors are used, a greater number of logic states are possible. In addition, each possible combination may be represented as a binary number.

The logic module has a defined output 144 for each of the logic states 142. In the illustrated embodiment, there are inputs from nine voltage sensors that define each logic state 142. Column 146 of the logic table 140 represents the voltage detected on phase "A" of main line power, i.e., vertical bus bar 76, by the bus monitor module 104. Column 148 of the logic table 140 represents the voltage detected on phase "B" of main line power, i.e., vertical bus bar 78 by the bus monitor module 104. Column 150 of the logic table 140 represents the voltage detected on phase "C" of main line power, i.e., vertical bus bar 80 (illustrated in FIG. 3), by the bus monitor module 104 (also illustrated in FIG. 3). Column 152 of the logic table 140 represents the voltage detected downstream of the disconnect switch 28 of phase "A", i.e., phase 92, by voltage sensor 114. Column 154 of the logic table 140 represents the voltage detected downstream of the disconnect switch 28 of phase "B", i.e., phase 94, by voltage sensor 116. Column 156 of the logic table 140 represents the voltage detected downstream of the disconnect switch 28 of phase "C", i.e., phase 96, by voltage sensor 118. Column 158 of the logic table 140 represents the voltage detected downstream of the fuse 32 of phase "A" by voltage sensor 122. Column 160 of the logic table 140 represents the voltage detected downstream of the fuse 32 of phase "B" by voltage sensor 124. Column 162 of the logic table 140 represents the voltage detected downstream of the fuse 32 of phase "C" by voltage sensor 126. The decimal equivalent of each binary number is represented in column 164 of logic table 140.

In the illustrated embodiment, each logic state 142 has a corresponding device diagnostic output 166 and hazard code output 168. The device diagnostic output 166 is adapted to facilitate a diagnosis of a fault or improper condition and may or may not be visible on the indicators 46. The hazard code output 168 is adapted to be displayed on the indicators 46, 132.

Each row of logic table 140 represents a specific combination of inputs and a corresponding output. In addition, the rows are displayed in ascending order. For example, row 170 represents the condition where no voltage is detected by any of the nine voltage sensors. This corresponds to a logic state/binary number of "000000000." This corresponds to the decimal number "0." For this logic state, the logic table 140 produces a device diagnostic output 166 ("main off") to indicate that there is no main power on the vertical bus bars. This also corresponds to a hazard code output 168 ("main fault") to indicate that there is a fault in the main power within the MCC 10. The next row 172 represents the condition wherein a voltage is detected by voltage sensor 126 on phase "C" downstream of the fuse 32, but no voltage is detected by any of the other voltage sensors. This corresponds to a logic state/binary number of "000000001", or "1" in decimal numbers. As this condition should not exist without at least main power being detected on phase "C", the logic module 102 produces a device diagnostic output 166 ("illegal condition") to indicate that an illegal condition exists and a hazard code output 168 ("system fault") to indicate that there is a fault in the system.

In the illustrated logic table 140, the same outputs 144 are produced for each increasing logic state 142 until the logic state corresponding to decimal number "64" is achieved, as illustrated in row 174. This corresponds to a condition wherein a voltage is detected on phase "C" of vertical bus bar 80 by the bus monitor module 104, but no voltages are detected by any of the other voltage sensors. Because this condition represents a fault in the main power, the logic module 102 produces a "Main Fault" diagnostic device output 166 and a "Main Fault" hazard code output 168 for this logic state. Various combinations of outputs 144 are produced for each increasing logic state 142 until the logic state corresponding to decimal number "448" is achieved.

Row 176 of the logic table 140 corresponds to the binary number "111000000", or decimal number "448", and represents the condition whereby voltage is detected by the bus monitor module 104 for each phase of main power, but no voltage is detected downstream of the disconnect 26 or the fuses 32 by any of the voltage sensors. This logic state represents the desired condition for accessing the interior of the motor controller 20 because proper operation of the disconnect 26 in isolating the main power from the motor controller 20 has been verified. Without power being detected on all three phases of main power, the motor controller cannot be verified as being electrically isolated from the main power. Because this condition represents the condition wherein the motor controller 20 is isolated from the main power, the logic module 102 produces a diagnostic device output 166 and a hazard code output 168 ("Unit Power Off.") to indicate that the unit is turned off and that the disconnect has isolated the device.

Row 178 of the logic table 140 corresponds to the binary number "11100100", or decimal number "456", and represents the condition whereby voltage is detected on all three phases of the main power by the bus monitor module 104 and downstream of the disconnect 26 on phase "C" 96 by voltage sensor 118. This logic state implicates a failure of the disconnect 26. The failure may be in the electrical switch 28 of phase "C" of the disconnect 26 or a failure of the electrical switches 28 of phases "A" 92 and "B" 94. Because this condition represents a failure of at least a portion of the disconnect 26, the logic module 102 produces a diagnostic device output 166 corresponding to a "DS Fault" and a "Disc. Sw Fault" hazard code output 168 for this logic state to indicate a failure in the disconnect switch 26.

Row 180 of the logic table 140, corresponding to the binary number "11111100", or decimal number "504", represents the condition whereby voltage is detected on all three phases of the main power by the bus monitor module 104 and downstream of the disconnect 26 on all three phases, but no voltages are detected by the second group 120 of voltage sensors downstream of the fuses 32. This condition may represent a failure of all three fuses. Because this condition represents a failure of at least one fuse 32, the logic module 102 produces a "Blown Fuse" diagnostic device output 166 and a "Blown Fuse" hazard code output 168 for this logic state.

Finally, row 182 of the logic table 140, corresponding to the binary number "11111111", or decimal number "511", represents the condition whereby voltage is detected on all three phases of the main power by the bus monitor module 104, all three phases downstream of the disconnect 26 by the first group 112 of voltage sensors, and on all three phases downstream of the fuses 32 by the second group 120 of voltage sensors. This condition represents the normal operating condition for supplying power to the motor controller 20. Thus, the logic module 102 produces a "All On" diagnostic device output 166 and a "All On-Normal" hazard code output 168 for this logic state.

The voltage verification system 44 may use software to perform its various functions. In addition, the voltage verification system 44 may also comprise self-diagnosis and/or self-testing software to verify proper operation of the voltage verification system 44.

The above-described system enables the operational status/condition of an electrical system to be verified without accessing the interior of the system. The system also is operable to provide a positive indication that no voltages are present within the interior of an electrical enclosure prior to entering the enclosure.

While the invention may be susceptible to various modifications and alternative forms, specific embodiments have been shown in the drawings and have been described in detail herein by way of example only. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A voltage verification system for an electrical system, comprising:
a processor unit coupleable to a voltage detection system in an electrical enclosure, the voltage detection system configured to detect a first voltage input to the enclosure and a second voltage at a point within the enclosure, wherein at least one of the voltage detection system and the processor unit is operable to convert the first and second voltages detected by the voltage detection system into digital signals, the processor unit being operable to provide an output derived from a truth table such that a first signal is provided for opening the enclosure only if the first voltage is substantially non-zero and the second voltage is substantially zero.

2. The system as recited in claim 1, comprising the voltage detection system, wherein the voltage detection system is operable to detect a plurality of voltages within the enclosure and to provide signals representative thereof to the processor unit, and wherein the processor unit provides the output based upon a truth table that includes the plurality of voltages.

3. The system as recited in claim 2, wherein the voltage detection system is electrically coupled to the processor unit.

4. The system as recited in claim 2, wherein the voltage detection system is optically coupled to the processor unit.

5. The system as recited in claim 2, wherein the voltage detection system comprises at least one contact voltage detector.

6. The system as recited in claim 2, wherein the voltage detection system comprises at least one non-contact voltage detector.

7. The system as recited in claim 1, wherein the truth table comprises a defined output representative for each possible combination of voltages detected by the voltage detection system.

8. The system as recited in claim 1, wherein the output corresponds to a loss of electrical continuity between a plurality of components of the electrical system.

9. An electrical system, comprising:
an electrical connection point operable to connect an electrical device to an external source of power;
a switch electrically coupled to the electrical system connection point; and
a voltage verification system operable to detect voltage at a location upstream of the electrical connection point and at a location downstream of the switch and to provide a positive indication if a no-voltage condition is detected at at least one of the location upstream of the electrical connection point and the location downstream of the switch.

10. The system as recited in claim 9, comprising a short-circuit preventing device, wherein the voltage verification system is operable to detect voltage at a location downstream of the short-circuit preventing device.

11. The system as recited in claim 10, wherein the voltage verification system provides a positive indication that the electrical device is de-energized when voltage is detected at the location upstream of the electrical connector and no voltages are detected at the location downstream of the switch and downstream of the short-circuit preventing device.

12. The electrical device as recited in claim 10, wherein the voltage verification system comprises a logic circuit and the voltage verification system is adapted to convert each voltage detected into an input to the logic circuit.

13. The electrical device as recited in claim 12, wherein the logic circuit is programmed to produce a defined output corresponding to each possible combination of inputs to the logic circuit.

14. The electrical device as recited in claim 9, wherein the voltage verification system comprises an indicator disposed on the exterior of the electrical device, the indicator being operable to produce a visible indication corresponding to each of the plurality of outputs.

15. An electrical system, comprising:
an enclosure;
an electrical device housed within the enclosure and electrically coupled to a power line through the enclosure;
a voltage verification system operable to produce a digital signal representative of line voltage applied to the enclosure and at plurality of locations internal to the enclosure, wherein the voltage verification system is operable to process the digital signals to produce an output based on a truth table defining possible states of the line voltage and voltage at the plurality of locations.

16. The system as recited in claim 15, wherein the power line comprises a three-phase power bus.

17. The system as recited in claim 16, wherein the electrical device comprises a motor controller electrically coupleable to the three-phase power bus to couple three-phase power to an electric motor.

18. The system as recited in claim 16, wherein the electrical device comprises a switch operable to selectively isolate the electrical device from the three-phase power bus, and within the plurality of locations includes locations upstream and downstream of the device.

19. The system as recited in claim 18, wherein the electrical device comprises a switch operable to selectively isolate a downstream electrical device from the three-phase power bus, and within the plurality of locations includes locations upstream and downstream of the device.

20. The system as recited in claim 19, wherein the voltage verification system is operable to detect voltage in each phase of the three-phase power bus and in each phase downstream of the switch.

21. The system as recited in claim 19, comprising a short-circuit preventing device located in each phase downstream of the switch, the voltage verification system being operable to detect voltage in each phase between the switch and the short-circuit preventing device in each phase downstream of each short-circuit preventing device.

22. The system as recited in claim 15, wherein the voltage verification system comprises a bus voltage module disposed within the enclosure and a first voltage sensor located external to the enclosure to provide a signal representative of line voltage to the module, the module being electrically isolated from the power line.

23. The system as recited in claim 22, wherein the first voltage sensor comprises a light emitter and the module comprises a light receiver.

24. The system as recited in claim 22, wherein the first voltage sensor is a non-contact voltage sensor.

25. The system as recited in claim 22, wherein the voltage verification system comprises a plurality of voltage sensors disposed within the electrical device and electrically coupled to the module.

26. The voltage verification system as recited in claim 22, wherein the voltage verification system comprises a logic module coupled to the bus voltage module, the logic module being programmed to produce a specific output for each possible value of the digital signal.

27. The motor control center as recited in claim 26, wherein the voltage verification system is coupleable to a communications network to provide the specific output to the communications network.

28. A method of accessing the interior of an electrical device coupled to power, comprising:

viewing a positive indication provided by a voltage verification system that no hazardous voltages are present within the electrical device, the indication being generated based upon voltages sensed within the device and a truth table of possible states of the voltages; and opening an access into the interior of the electrical device after viewing the positive indication that no hazardous voltages are present within the device based upon the truth table.

29. The method as recited in claim 28, wherein the positive indication represents that the system detected a voltage upstream of an isolation switch and detected no voltage downstream of the isolation switch.

30. The method as recited in claim 28, comprising entering the interior of the electrical device.

31. A method of accessing the interior of an electrical device coupled to power, comprising:

detecting voltage input to the device and at a plurality of locations within the device; and generating an output signal based upon a truth table of possible states of the input voltage and voltage at the plurality of locations.

32. The method of claim 31, wherein the output signal is indicative of a desired condition for accessing the interior of the electrical device where the input voltage is present and voltage at a selected location within the device is absent.

33. The method of claim 31, further comprising providing a visual indication of a desired condition for accessing the interior of the electrical device based upon the output signal.

34. The method of claim 31, further comprising providing a visual indication of an undesired condition for accessing the interior of the electrical device based upon the output signal.

* * * * *